(12) United States Patent
Park et al.

(10) Patent No.: US 11,144,093 B2
(45) Date of Patent: Oct. 12, 2021

(54) DISPLAY DEVICE

(71) Applicant: SAMSUNG DISPLAY CO., LTD., Yongin-Si (KR)

(72) Inventors: Jaechun Park, Seoul (KR); Changmin Park, Gwangmyeong-si (KR); Sang wol Lee, Yongin-si (KR); Jang doo Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/555,931

(22) Filed: Aug. 29, 2019

(65) Prior Publication Data

US 2020/0089277 A1    Mar. 19, 2020

(30) Foreign Application Priority Data

Sep. 18, 2018 (KR) .................. 10-2018-0111530

(51) Int. Cl.
  *G06F 1/16* (2006.01)
  *G09F 9/30* (2006.01)
  *H01L 51/00* (2006.01)

(52) U.S. Cl.
  CPC .......... *G06F 1/1641* (2013.01); *G06F 1/1652* (2013.01); *G09F 9/301* (2013.01); *H01L 51/0097* (2013.01); *G06F 2203/04102* (2013.01)

(58) Field of Classification Search
None
See application file for complete search history.

(56) References Cited

U.S. PATENT DOCUMENTS

| 8,803,816 B2 | 8/2014 | Kilpatrick, II et al. |
| 10,104,788 B2 | 10/2018 | Choi et al. |
| 10,551,880 B1* | 2/2020 | Ai .................. G06F 1/1641 |
| 2015/0062525 A1* | 3/2015 | Hirakata ........... G02F 1/133305 |
| | | 349/158 |
| 2018/0011576 A1 | 1/2018 | Ryu |

FOREIGN PATENT DOCUMENTS

| KR | 10-0415695 B1 | 1/2004 |
| KR | 10-1320150 B1 | 10/2013 |
| KR | 10-2017-0117277 A | 10/2017 |

\* cited by examiner

*Primary Examiner* — Brian M Butcher
(74) *Attorney, Agent, or Firm* — Lewis Roca Rothgerber Christie LLP

(57) ABSTRACT

A display device includes a flexible display module and a support member located below the flexible display module. The support member includes a first support member and a second support member. A portion of each of the first support member and the second support member, which is adjacent to a bending axis, is bent to have a curvature.

20 Claims, 17 Drawing Sheets

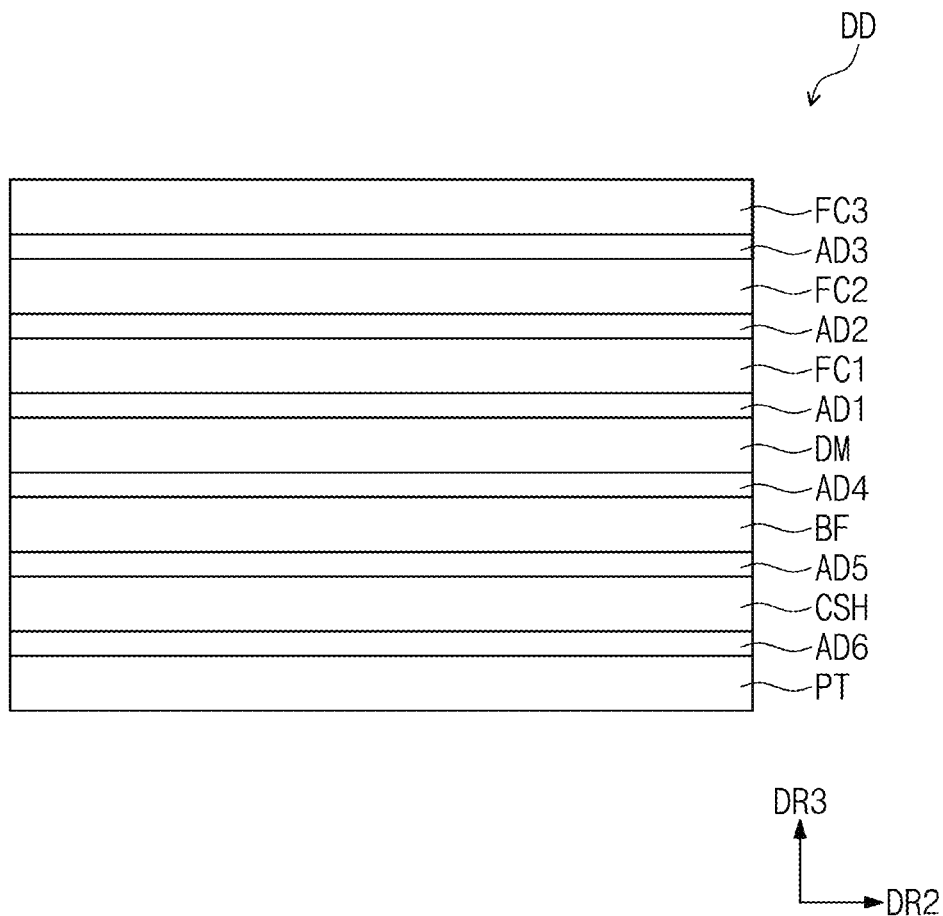

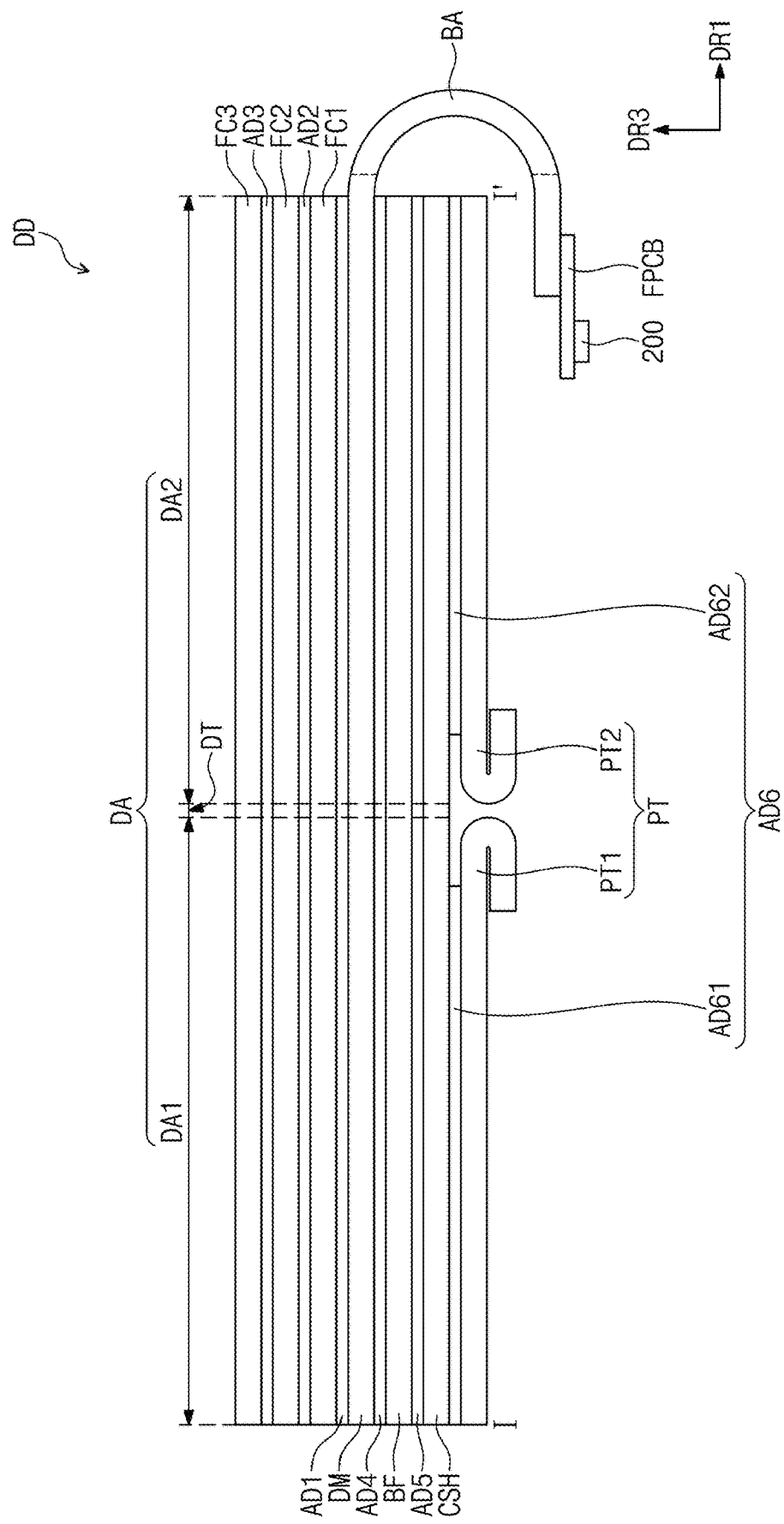

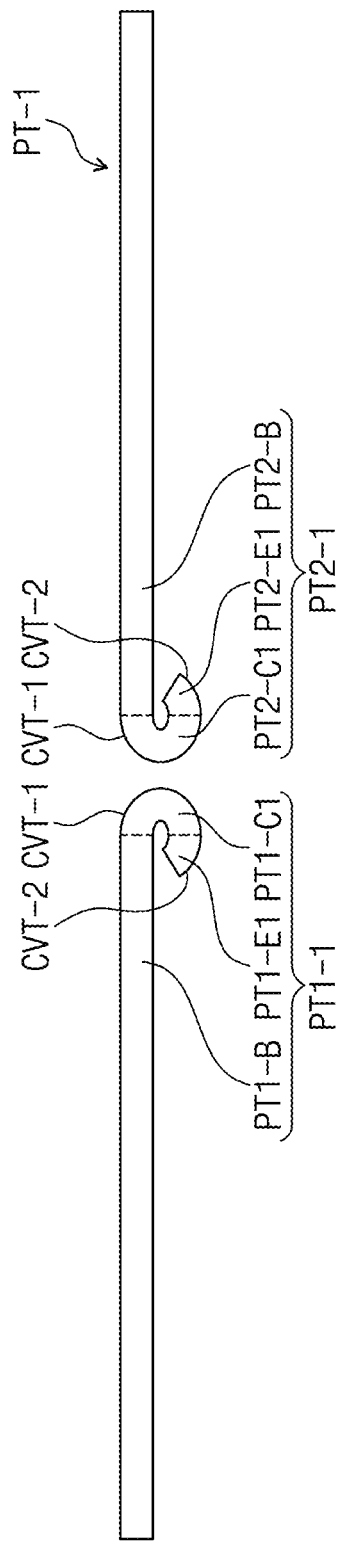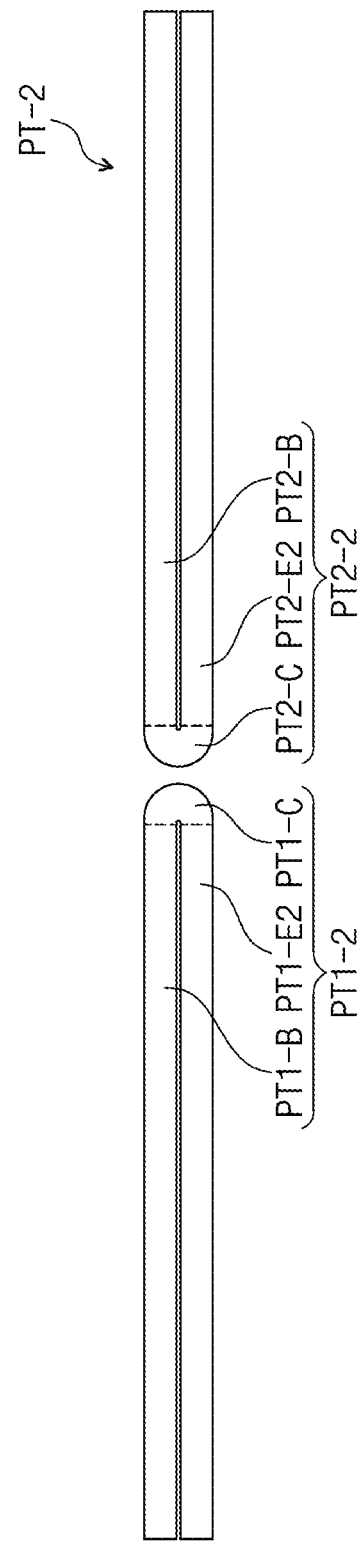

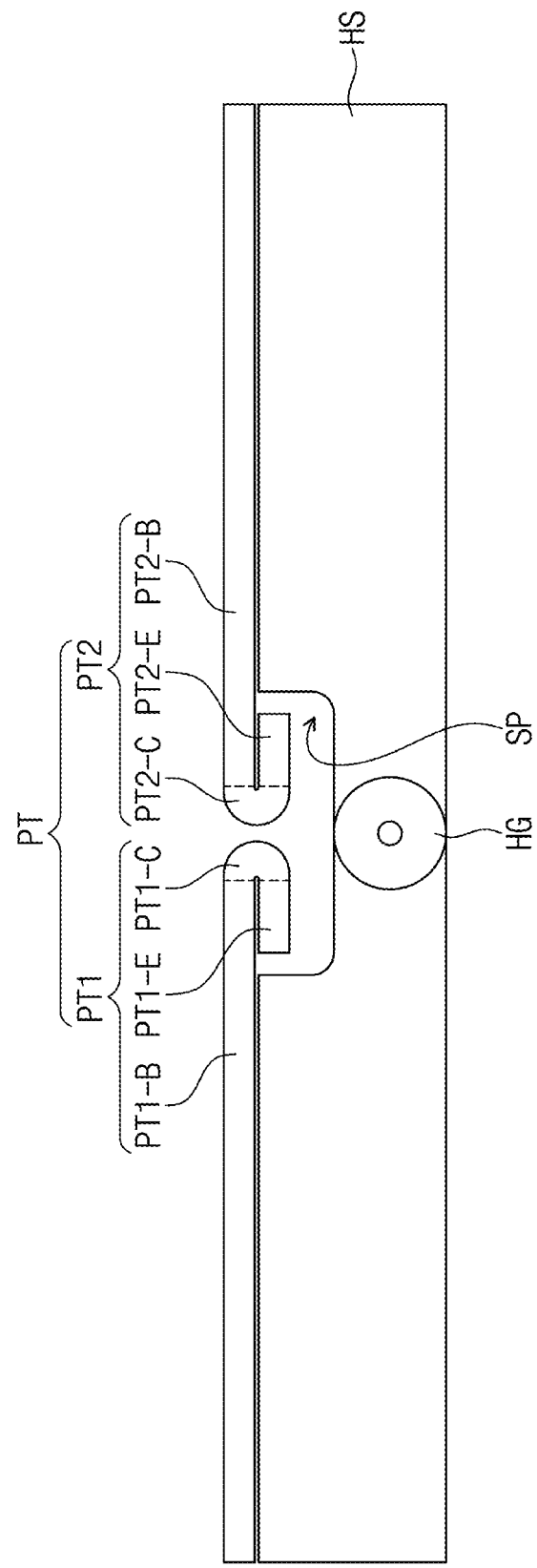

DISPLAY DEVICE

CROSS-REFERENCE TO RELATED APPLICATION

This patent application claims priority to and the benefit of Korean Patent Application No. 10-2018-0111530, filed on Sep. 18, 2018 in the Korean Intellectual Property Office, the entire content of which is herein incorporated by reference.

BACKGROUND

1. Field

Aspects of embodiments of the present disclosure relate to a display device.

2. Description of the Related Art

A display device displays various images on a display screen to provide information to a user. In general, the display device displays information within an allocated screen.

In recent years, a flexible display device including a bendable flexible display panel has been developed. The flexible display device may be folded, rolled, or bent like a paper, unlike a flat display device. The flexible display device, which is variously changeable in shape, may be carried regardless of a typical screen size, and be thus improved in convenience of the user.

SUMMARY

According to an aspect of embodiments of the present disclosure, a display device in which a folded portion having improved durability is provided. According to another aspect of embodiments of the present disclosure, a foldable display device having an improved yield rate of a manufacturing process and improved durability of a product by improving a strength of a portion corresponding to a folding axis is provided.

According to one or more embodiments of the inventive concept, a display device includes a display module and a support member. The display module includes a first display area and a second display area adjacent to the first display area, and is foldable with respect to a boundary line between the first display area and the second display area. The support member includes a first support member overlapping with the first display area and a second support member overlapping with the second display area, and is located below the flexible display module.

The first support member includes: a first base support portion; a first connection support portion extending from the first base support portion, located adjacent to the boundary line, and bent to have a curvature; and a first extension support portion extending from the first connection support portion and overlapping with the first base support portion.

The second support member includes: a second base support portion; a second connection support portion extending from the second base support portion, located adjacent to the boundary line, and bent to have a curvature; and a second extension support portion extending from the second connection support portion and overlapping with the second base support portion.

In an embodiment, the display device may further include an impact absorbing member between the flexible display module and the support member.

In an embodiment, the display device may further include an adhesion member including a first adhesion member and a second adhesion member, the adhesion member being between the impact absorbing member and the support member. The first base support portion may be coupled to the impact absorbing member by the first adhesion member, and the second base support portion may be coupled to the impact absorbing member by the second adhesion member.

In an embodiment, at least a portion of the first connection support portion, the first extension support portion, at least a portion of the second connection support portion, and the second extension support portion may be spaced apart from the adhesion member.

In an embodiment, the first adhesion member may be spaced apart from the second adhesion member.

In an embodiment, at least a portion of a surface of the first base support portion may contact at least a portion of a surface of the first extension support portion, and at least a portion of a surface of the second base support portion may contact at least a portion of a surface of the second extension support portion.

In an embodiment, each of the first extension support portion and the second extension support portion may be bent to have a curvature, and the first extension support portion may be spaced apart from the first base support portion, and the second extension support portion may be spaced apart from the second base support portion.

In an embodiment, the first base support portion may have a same area as that of the first extension support portion, and the second base support portion may have a same area as that of the second extension support portion.

In an embodiment, the first base support portion may have an area greater than that of the first extension support portion, and the second base support portion may have an area greater than that of the second extension support portion.

In an embodiment, the adhesion member may further include a third adhesion member between the first adhesion member and the second adhesion member and a fourth adhesion member spaced apart from the third adhesion member.

In an embodiment, the third adhesion member may be coupled to only one surface of the first support member, and the fourth adhesion member may be coupled to only one surface of the second support member.

In an embodiment, each of the third adhesion member and the fourth adhesion member may have a black color.

In an embodiment, each of the first support member and the second support member may comprise a metal.

In an embodiment, the flexible display module may include a plurality of pixels each including a light emitting element, and a driving circuit configured to provide a data signal to the plurality of pixels. The driving circuit may be below the support member.

In an embodiment, the display device may further include a housing configured to accommodate the flexible display module, the impact absorbing member, the adhesion member, and the support member. The housing may support the first base support portion and the second base support portion, and the first connection support portion and the second connection support portion may be accommodated in a space defined in the housing.

In an embodiment, when the flexible display module is folded with respect to the boundary line, the first connection support portion and the second connection support portion may be spaced apart from the housing. In an embodiment, when the flexible display module is folded with respect to the boundary line, the first connection support portion and the second connection support portion may be always spaced apart from the housing.

According to one or more embodiments of the inventive concept, a display device includes a flexible display module and a support member. The flexible display module includes a flexible display panel and an input sensing circuit on the flexible display panel, the flexible display module being foldable with respect to a bending axis. The support member includes a first support member below the flexible display module and a second support member adjacent to the first support member. The bending axis is defined by a boundary line between the first support member and the second support member.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings:

FIG. 3 is a cross-sectional view illustrating a display device according to an embodiment of the inventive concept;

FIG. 9A is a view illustrating a portion of a cross-section taken along the line I-I' of FIG. 1;

FIGS. 10 and 11 are views each illustrating a support member, according to some embodiments of the inventive concept;

FIG. 13 is a view illustrating a support member and a housing according to an embodiment of the inventive concept.

DETAILED DESCRIPTION

Figure 1:
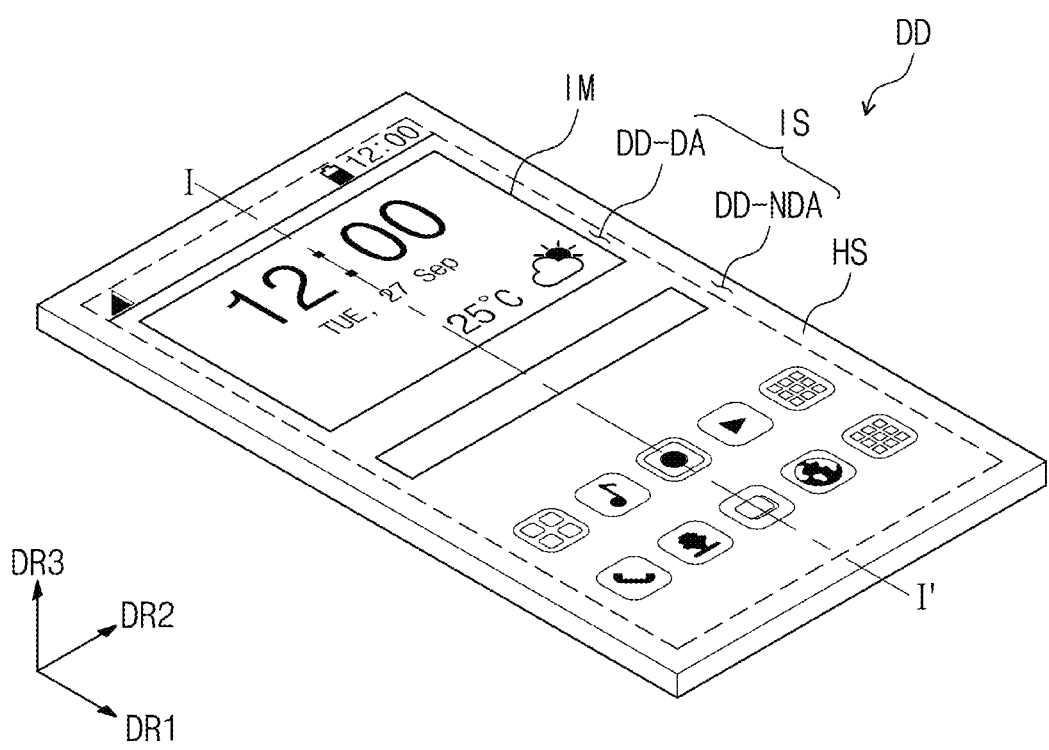
FIG. 1 is a perspective view illustrating a display device according to an embodiment of the inventive concept.

Herein, some embodiments of the inventive concept will be described with reference to the accompanying drawings. Also, in the figures, the thickness, ratio, and dimensions of components may be exaggerated for clarity of illustration.

As used herein, the term "and/or" includes any and all combinations of one or more of the associated listed items.

The meaning of "include" or "comprise" specifies a property, a fixed number, a step, an operation, an element, a component, or a combination thereof, but does not exclude other properties, fixed numbers, steps, operations, elements, components, or combinations thereof.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display device DD according to an embodiment of the inventive concept. In an embodiment, as illustrated in FIG. 1, a display surface IS on which an image IM is displayed is parallel to a surface defined by a first directional axis DR1 and a second directional axis DR2. A normal direction of the display surface IS, i.e., a thickness direction of the display device DD, indicates a third directional axis DR3. A front surface (or top surface) and a rear surface (or bottom surface) of each of members are distinguished by the third directional axis DR3. However, directions indicated by the first to third directional axes DR1, DR2, and DR3 may be a relative concept and converted with respect to each other. Herein, first to third directions may be directions indicated by the first to third directional axes DR1, DR2, and DR3 and designated by the same reference numerals, respectively.

The display device DD according to an embodiment of the inventive concept may be a foldable display device. The display device DD according to an embodiment of the inventive concept may be used for large-sized electronic equipment, such as televisions and monitors, and small and medium-sized electronic equipment, such as mobile phones, tablet PCs, navigation units for vehicles, game consoles, and smart watches.

As illustrated in FIG. 1, the display surface IS of the display device DD may include a plurality of areas. The display device DD includes a display area DD-DA on which the image IM is displayed, and a non-display area DD-NDA disposed adjacent to the display area DD-DA. The non-display area DD-NDA may be an area on which an image is not displayed. FIG. 1 illustrates icons of applications and a clock window as an example of the image IM. In an embodiment, the display area DD-DA may have a rectangular shape, and the non-display area DD-NDA may surround the display area DD-DA. However, embodiments of the inventive concept are not limited thereto. For example, the display area DD-DA and the non-display area DD-NDA may be relatively designed in shape.

The display device DD may include a housing HS. The housing HS may be disposed at an outer portion of the display device DD and accommodate components therein.

FIGS. 2A to 2G are views each exemplarily illustrating a state in which the display device DD in FIG. 1 is folded.

Figure 2A:
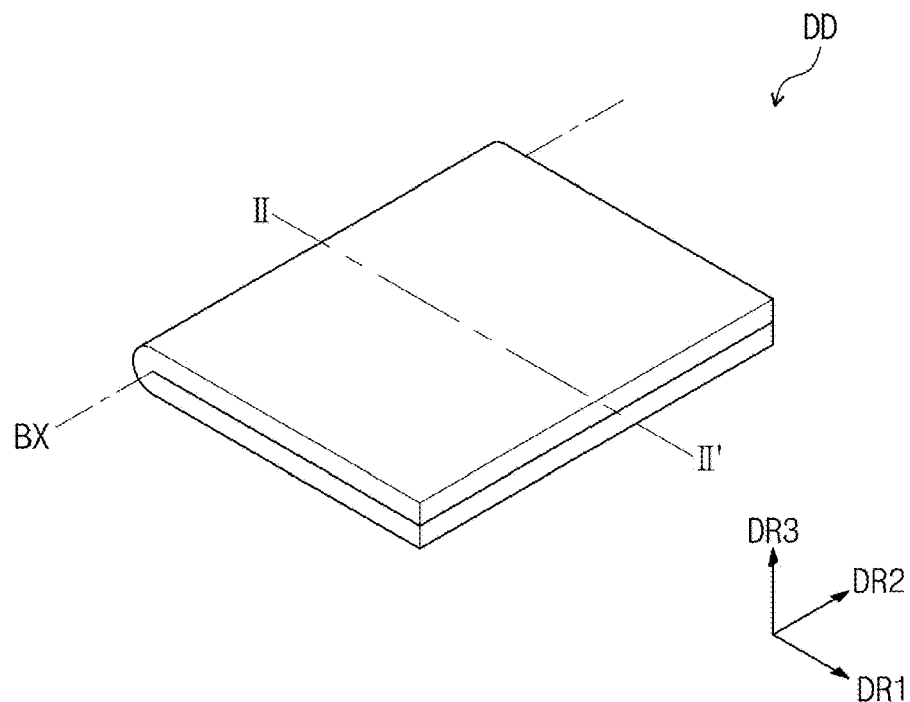
FIGS. 2A to 2G are views each exemplarily illustrating a state in which the display device in FIG. 1 is folded.
Figure 2B:
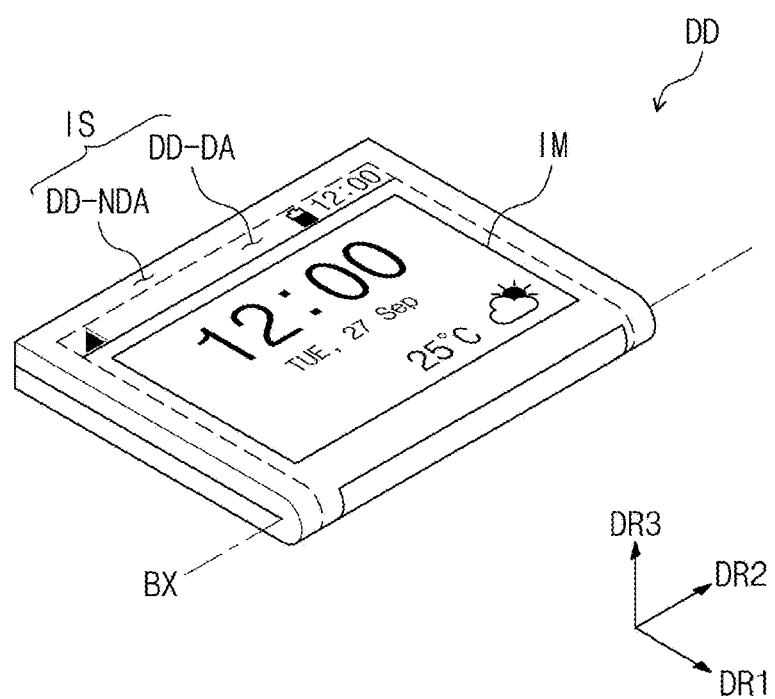
Figure 2C:
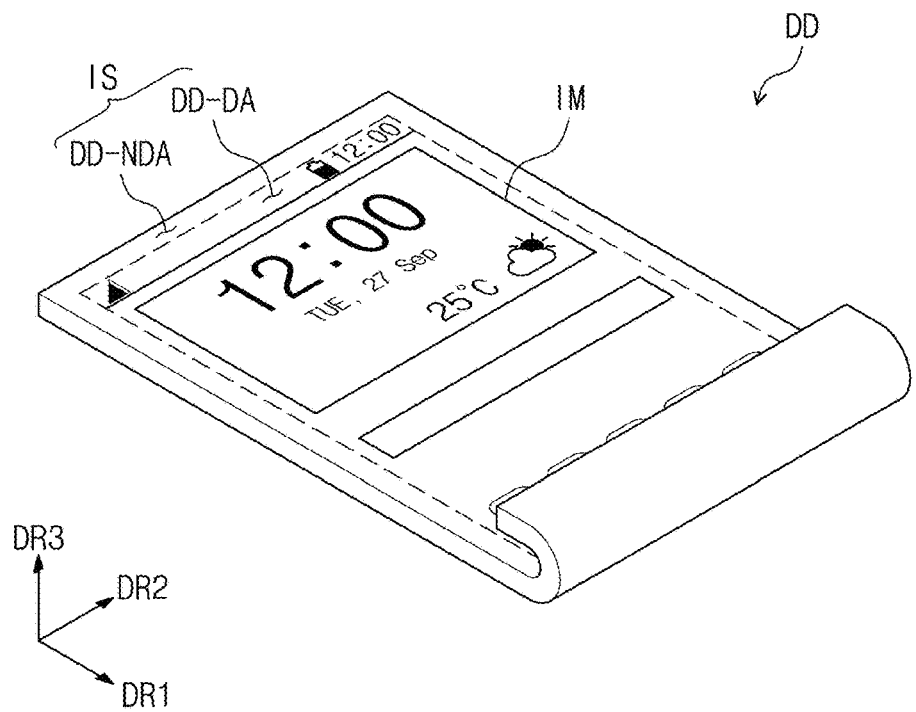
Figure 2D:
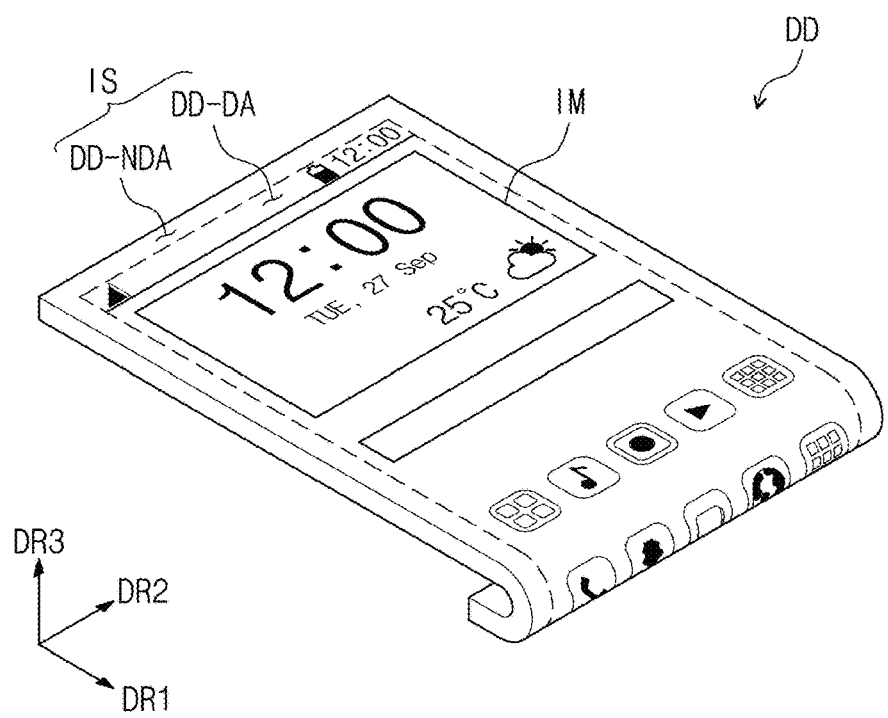
Figure 2E:
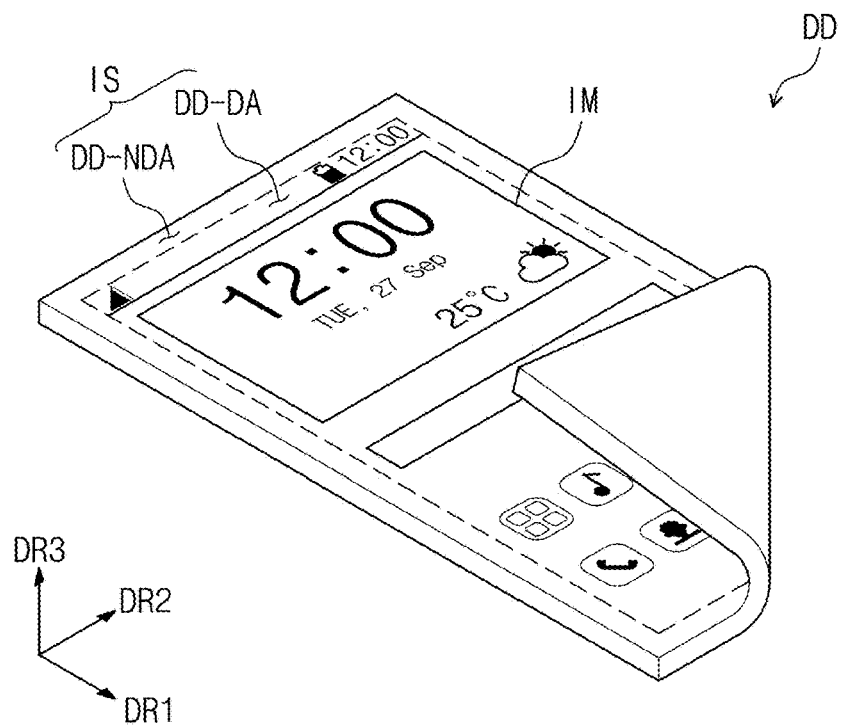

Referring to FIG. 2A, the display device DD according to an embodiment of the inventive concept may be in-folded with respect to a bending axis BX that is parallel to the second direction DR2. Referring to FIG. 2B, the display device DD according to an embodiment of the inventive concept may be out-folded with respect to the bending axis BX that is parallel to the second direction DR2. Referring to FIG. 2C, the display device DD according to an embodiment of the inventive concept may be folded inward from an end of the display device DD. Referring to FIG. 2D, the display device DD according to an embodiment of the inventive concept may be folded outward from an end of the display device DD. Referring to FIG. 2E, the display device DD according to an embodiment of the inventive concept may be folded in a diagonal direction.

Figure 2F:
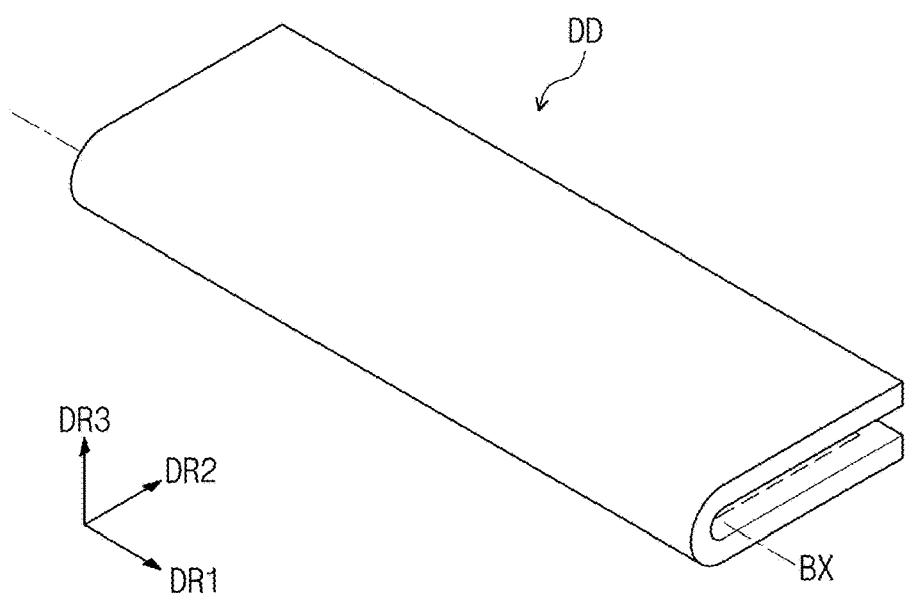
Figure 2G:
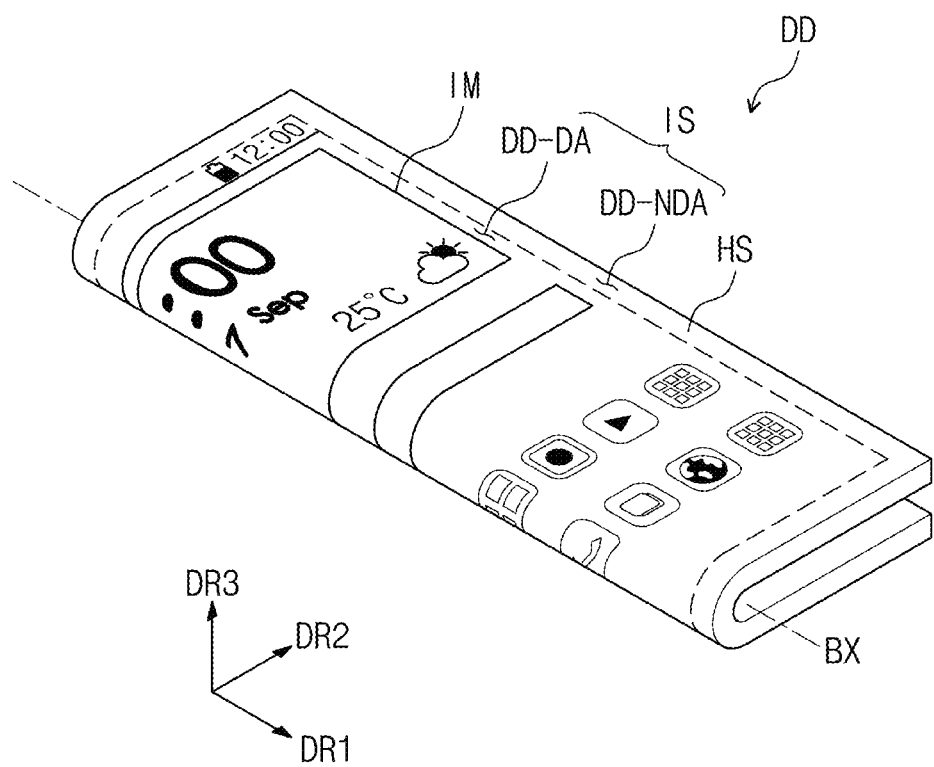

Referring to FIG. 2F, the display device DD according to an embodiment of the inventive concept may be in-folded with respect to a bending axis BX that is parallel to the first direction DR1. Referring to FIG. 2G, the display device DD according to an embodiment of the inventive concept may be out-folded with respect to the bending axis BX that is parallel to the first direction DR1.

As described above, the bending axis BX may be variously changed in direction.

Although some methods of folding the display device DD are exemplarily illustrated in FIGS. 2A to 2G, embodiments of the inventive concept are not limited thereto.

Figure 4A:
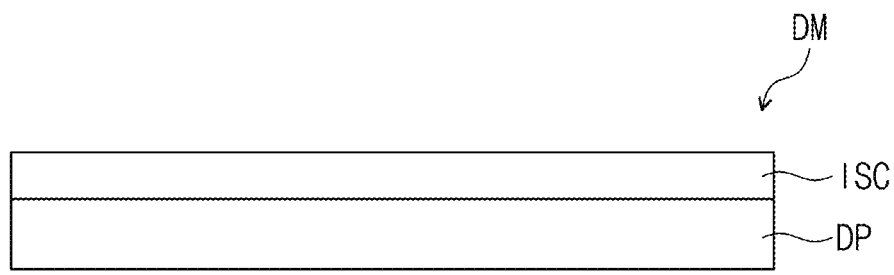
FIGS. 4A and 4B are cross-sectional views illustrating a display module of a display device, according to some embodiments of the inventive concept.
Figure 4B:
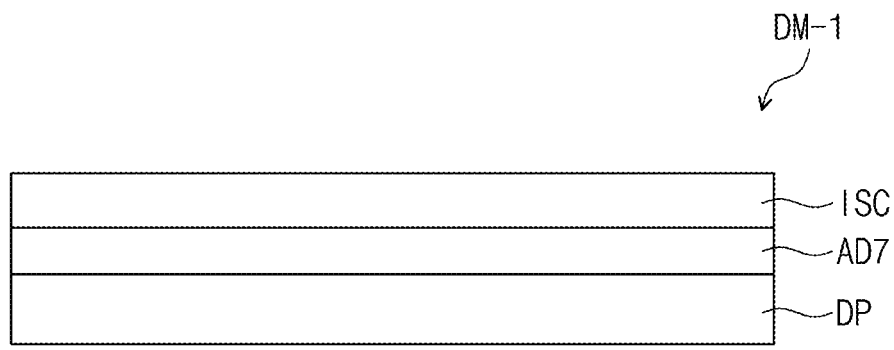

FIG. 3 is a cross-sectional view illustrating the display device DD according to an embodiment of the inventive concept; and FIGS. 4A and 4B are cross-sectional views illustrating a display module DM, DM-1 in FIG. 3, according to some embodiments of the inventive concept. FIG. 3 illustrates a cross-section defined by the second direction DR2 and the third direction DR3.

The display device DD may include a display module DM, a plurality of functional layers FC1 to FC3, a base film BF, an impact absorbing member CSH, a support member PT, and a plurality of adhesion member AD1 to AD6. In other embodiments of the inventive concept, one or more components of the display device DD may be omitted.

In an embodiment of the inventive concept, each of the adhesion members AD1 to AD6 may be a pressure sensitive adhesive (PSA).

The functional layers FC1 to FC3 may be disposed above the display module DM.

A first functional layer FC1 may be attached to the display module DM by a first adhesion member AD1. A second functional layer FC2 may be attached to the first functional layer FC1 by a second adhesion member AD2. A third functional layer FC3 may be attached to the second functional layer FC2 by a third adhesion member AD3.

In an embodiment, each of the functional layers FC1 to FC3 may contain a polymer material. Each of the functional layers FC1 to FC3 may be a film-type. In an embodiment, each of the functional layers FC1 to FC3 may have a modulus of about 2 GPa or more and about 100 GPa or less.

In an embodiment, each of the functional layers FC1 to FC3 may have a thickness of about 35 μm or more and about 60 μm or less. When each of the functional layers FC1 to FC3 has a thickness less than about 35 μm, performance of an originally intended function may be degraded, and when greater than about 60 μm, flexibility of the display device DD may be decreased. In an embodiment of the inventive concept, the first functional layer FC1 may be a polarizing functional layer that polarizes incident light. The second functional layer FC2 may be an impact absorbing functional layer for absorbing an impact applied from the outside. The third functional layer FC3 may be a window functional layer providing an external shape of the display device DD. In another embodiment of the inventive concept, one or more of the first to third functional layers FC1 to FC3 may be omitted.

The base film BF, the impact absorbing member CSH, and the support member PT are disposed below the display module DM.

The base film BF may be attached to the display module DM by a fourth adhesion member AD4. The base film BF may contain a polymer material.

The impact absorbing member CSH may be attached to the base film BF by a fifth adhesion member AD5. The impact absorbing member CSH may contain a polymer material. The impact absorbing member CSH may be a layer for absorbing an impact applied from the outside.

The support member PT may be attached to the impact absorbing member CSH by a sixth adhesion member AD6. The support member PT may support the display module DM. The support member PT may include a hinge (not shown) for folding or bending the display module DM. The support member PT may have a rigid property.

Referring to FIG. 4A, in an embodiment, the display module DM may include a display panel DP and an input sensing circuit ISC. The input sensing circuit ISC may detect a touch and/or a pressure applied from the outside.

In an embodiment, the input sensing circuit ISC may be directly disposed on a thin-film encapsulation layer (not shown) of the display panel DP. Here, a feature of "directly disposed" represents that the input sensing circuit ISC is disposed on the display panel DP without an additional adhesion member therebetween.

Referring to FIG. 4B, in another embodiment, a display module DM-1 may include a display panel DP, an input sensing circuit ISC, and a seventh adhesion member AD7. The display panel DP and the input sensing circuit ISC may be attached by the seventh adhesion member AD7.

Figure 5:
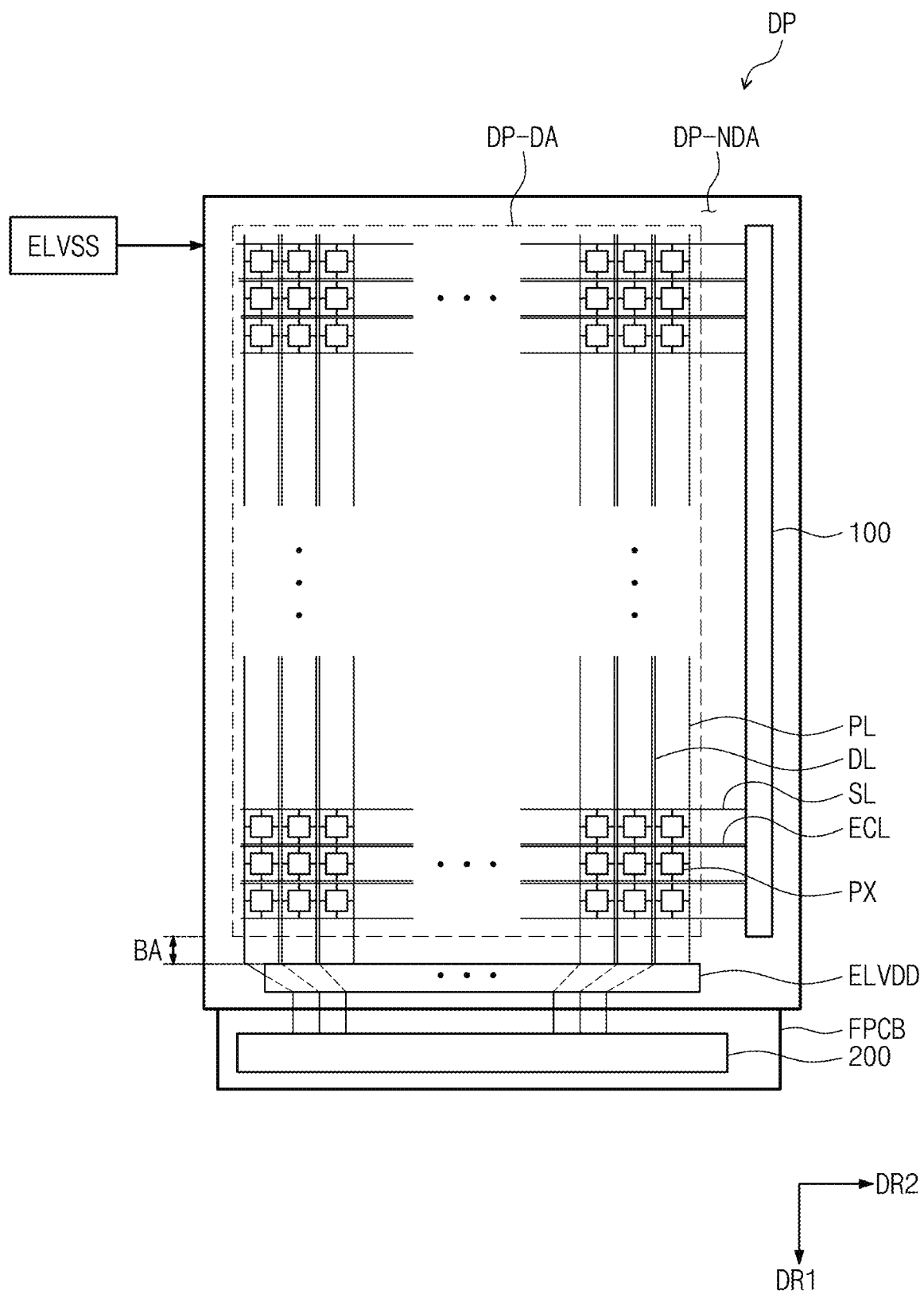
FIG. 5 is a plan view illustrating a display panel according to an embodiment of the inventive concept.

FIG. 5 is a plan view illustrating the display panel DP according to an embodiment of the inventive concept.

The display panel DP includes a display area DP-DA and a non-display area DP-NDA on a plane. In an embodiment, the non-display area DP-NDA may be defined along an edge of the display area DP-DA. The display area DP-DA and the non-display area DP-NDA of the display panel DP correspond to the display area DD-DA and the non-display area DD-NDA of the display device DD in FIG. 1, respectively.

The display panel DP may include a scan driving unit 100, a data driving unit 200, a plurality of scan lines SL, a plurality of light emitting control lines ECL, a plurality of data lines DL, a plurality of power lines PL, and a plurality of pixels PX (herein, referred to as pixels). The pixels PX are disposed on the display area DP-DA. In an embodiment, each of the pixels PX includes an organic light emitting element OLED (refer to FIG. 6) and a pixel circuit CC (refer to FIG. 6) connected thereto.

The scan driving unit 100 may include a scan driving part and a light emitting control driving part.

The scan driving part generates scan signals, and sequentially outputs the generated scan signals to the scan lines SL. The light emitting control driving part generates light emitting control signals, and outputs the generated light emitting control signals to the light emitting control lines ECL.

In another embodiment of the inventive concept, the scan driving part and the light emitting control driving part may be integrated into one circuit without being divided from each other in the scan driving unit 100.

In an embodiment, the scan driving unit 100 may include a plurality of thin-film transistors that are formed through a same process as the driving circuit of each of the pixels PX, e.g., a low temperature polycrystalline silicon (LTPS) process or a low temperature polycrystalline oxide (LTPO) process.

The data driving unit 200 outputs data signals to the data lines DL. The data signals are analog voltages corresponding to gray values of image data.

In an embodiment of the inventive concept, the data driving unit 200 may be mounted to a printed circuit board FPCB, and the printed circuit board FPCB may be connected to pads disposed on one end of the data lines DL. However, embodiments of the inventive concept are not limited thereto. For example, the data driving unit 200 may be directly mounted to the display panel DP.

The scan lines SL may extend in the second direction DR2 and be arranged in the first direction DR1 crossing the second direction DR2. Although the second direction DR2 and the first direction DR1 may be perpendicular to each other in an embodiment of the inventive concept, embodiments of the inventive concept are not limited thereto.

The light emitting control lines ECL may extend in the second direction DR2 and be arranged in the first direction DR1. That is, each of the light emitting control lines ECL may be arranged in parallel to the corresponding scan line of the scan lines SL.

The data lines DL may extend in the first direction DR1 and be arranged in the second direction DR2 crossing the first direction DR1. The data lines DL may provide the data signals to the corresponding pixels PX.

The power lines PL may extend in the first direction DR1 and be arranged in the second direction DR2. The power lines PL may provide a first power ELVDD to the corresponding pixels PX.

Each of the plurality of pixels PX is connected to a corresponding scan line of the scan lines SL, a corresponding light emitting control line of the light emitting control lines ECL, a corresponding data line of the data lines DL, and a corresponding power line of the power lines PL.

The non-display area DP-NDA of the display panel DP may include a bending area BA. When the display panel DP is bent with respect to the bending area BA, a surface area of the non-display area DP-NDA may decrease to provide the display device DD having a narrow bezel on a plane defined by the first direction DR1 and the second direction DR2. That is, the display device DD in which the non-display area DD-NDA in FIG. 1 has a small surface area may be provided.

Figure 6:
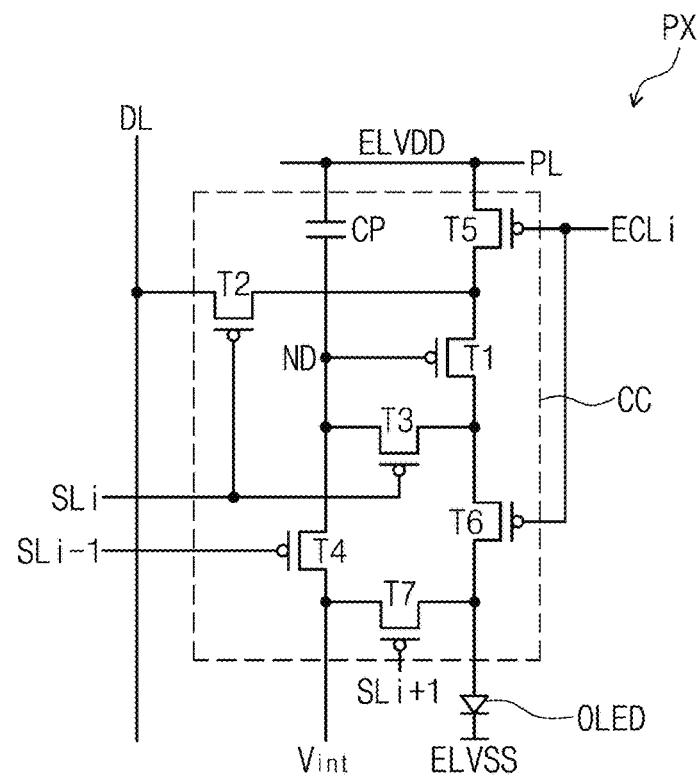
FIG. 6 is an equivalent circuit diagram illustrating a pixel according to an embodiment of the inventive concept.
Figure 7:
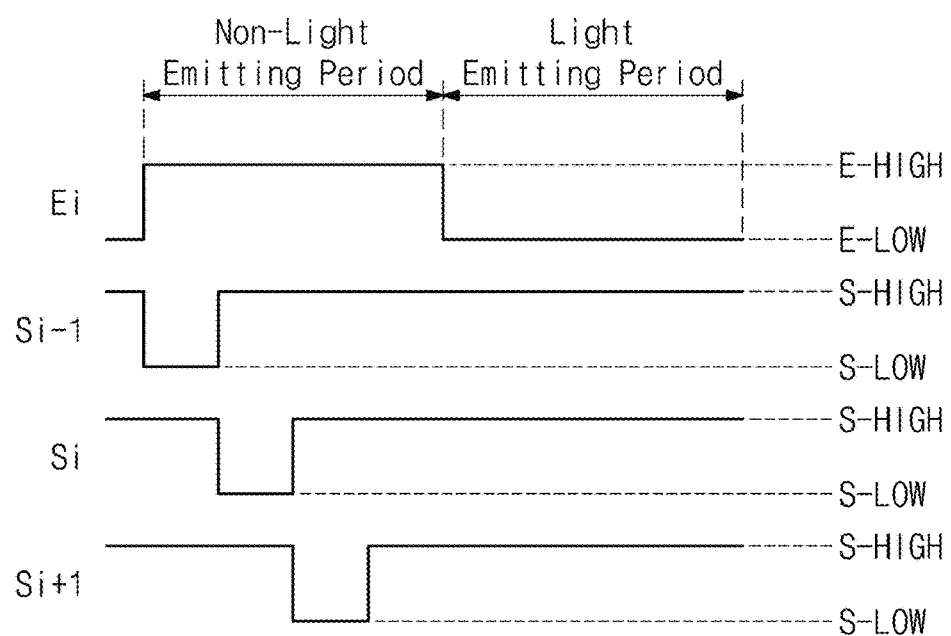
FIG. 7 is a view exemplarily illustrating a light emitting control signal and scan signals, which are applied to the pixel in FIG. 6.

FIG. 6 is an equivalent circuit diagram illustrating the pixel PX according to an embodiment of the inventive concept; and FIG. 7 is a view exemplarily illustrating a light emitting control signal Ei and scan signals Si−1, Si, Si+1, which are applied to the pixel PX in FIG. 6. In FIG. 6, the pixel PX connected to an i-th scan line SLi and an i-th light emitting control line ECLi is exemplarily illustrated.

The pixel PX may include an organic light emitting element OLED and a pixel circuit CC. The pixel circuit CC may include a plurality of transistors T1 to T7 and a capacitor CP. The pixel circuit CC controls a current amount flowing through the organic light emitting element OLED in response to the data signal.

The organic light emitting element OLED may emit light having luminance (e.g., predetermined luminance) in response to a current amount provided from the pixel circuit CC. To this end, the first power ELVDD may have a level greater than that of a second power ELVSS.

Each of the plurality of transistors T1 to T7 may include an input electrode (or a source electrode), an output electrode (or a drain electrode), and a control electrode (or a gate electrode). In this specification, one of the input electrode and the output electrode may be referred to as a first electrode, and the other thereof may be referred to as a second electrode, for convenience.

The first transistor T1 includes the first electrode connected to the first power ELVDD through the fifth transistor T5 and the second electrode connected to an anode electrode of the organic light emitting element OLED through the sixth transistor T6. The first transistor T1 may be referred to as a driving transistor in this specification.

The first transistor T1 controls the current amount flowing through the organic light emitting element OLED in response to a voltage applied to the control electrode.

The second transistor T2 is connected between the data line DL and the first electrode of the first transistor T1. Also, the control electrode of the second transistor T2 is connected to the i-th scan line. The second transistor T2 is turned on when the i-th scan signal Si is provided to the i-th scan line SLi and electrically connects the data line DL to the first electrode of the first transistor T1.

The third transistor T3 is connected between the second electrode of the first transistor T1 and the control electrode. A control electrode of the third transistor T3 is connected to the i-th scan line SLi. The third transistor T3 is turned on when the i-th scan signal Si is provided to the i-th scan line SLi and electrically connects the second electrode of the first transistor T1 to the control electrode. Accordingly, when the third transistor T3 is turned on, the first transistor T1 is connected in a diamond form.

The fourth transistor T4 is connected between a node ND and an initialization power generation part (not shown). Also, the control electrode of the fourth transistor T4 is connected to an i−1-th scan line SLi−1. The fourth transistor T4 is turned on when an i−1-th scan signal Si−1 is provided to the i−1-th scan line SLi−1 and provides an initialization voltage Vint to the node ND.

The fifth transistor T5 is connected between the power line PL and the first electrode of the first transistor T1. The control electrode of the fifth transistor T5 is connected to the i-th light emitting control line ECLi.

The sixth transistor T6 is connected between the second electrode of the first transistor T1 and the anode electrode of the organic light emitting element OLED. Also, the control electrode of the sixth transistor T6 is connected to the i-th light emitting control line ECLi.

The seventh transistor T7 is connected between an initialization power generation part (not shown) and the anode electrode of the organic light emitting element OLED. Also, the control electrode of the seventh transistor T7 is connected to an i+1-th scan line SLi+1. The seventh transistor T7 is turned on when an i+1-th scan signal Si+1 is provided to the i+1-th scan line SLi+1 and provides the initialization voltage Vint to the anode electrode of the organic light emitting element OLED.

The seventh transistor T7 may improve a black expression ability of the pixel PX. When the seventh transistor T7 is turned on, a parasitic capacitor (not shown) of the organic light emitting element OLED is discharged. Then, when black luminance is realized, the organic light emitting element OLED may not emit light due to a leakage current from the first transistor T1, and, accordingly, the black expression ability may be improved.

Additionally, although the control electrode of the seventh transistor T7 is connected to the i+1-th scan line SLi+1 in FIG. 6, embodiments of the inventive concept are not limited thereto. In another embodiment of the inventive concept, the control electrode of the seventh transistor T7 may be connected to the i-th scan line SLi or the i−1-th scan line SLi−1.

Although FIG. 6 is illustrated with respect to a PMOS, embodiments of the inventive concept are not limited thereto. In another embodiment of the inventive concept, the pixel PX may include a NMOS. In another embodiment of the inventive concept, the pixel PX may include a combination of the NMOS and the PMOS.

The capacitor CP is disposed between the power line PL and the node ND. The capacitor CP stores a voltage corresponding to the data signal. When the fifth transistor T5 and the sixth transistor T6 are turned on, a current amount flowing through the first transistor T1 may be determined on the basis of a voltage stored in the capacitor CP.

However, embodiments of the inventive concept are not limited to the structure of the pixel PX in FIG. 6. In other embodiments of the inventive concept, the pixel PX may be realized in any of various shapes for allowing the organic light emitting element OLED to emit light.

Referring to FIG. 7, the light emitting control signal Ei may have a high level E-HIGH or a low level E-LOW. Each of the scan signals SLi−1, SLi, and SLi+1 may have a high level S-HIGH or a low level S-LOW.

When the light emitting control signal Ei has the high level E-HIGH, the fifth transistor T5 and the sixth transistor T6 are turned off. When the fifth transistor T5 is turned off, the first electrode of the first transistor T1 and the power line PL are electrically cut off. When the sixth transistor T6 is turned off, the second electrode of the first transistor T1 and the anode electrode of the organic light emitting element OLED are electrically cut off. Accordingly, the organic light emitting element OLED does not emit light during a period in which the light emitting control signal Ei having the high level E-HIGH is provided to the i-th light emitting control line ECLi.

Thereafter, when the i−1-th scan signal Si−1 provided to the i−1-th scan line SLi−1 has the low level S-LOW, the fourth transistor T4 is turned on. When the fourth transistor T4 is turned on, the initialization voltage Vint is provided to the node ND.

When the i-th scan signal Si provided to the i-th scan line SLi has the low level S-LOW, the second transistor T2 and the third transistor T3 are turned on.

When the second transistor T2 is turned on, the data signal is provided to the first electrode of the first transistor T1. Here, since the node ND is initialized by the initialization voltage Vint, the first transistor T1 is turned on. When the first transistor T1 is turned on, a voltage corresponding to the data signal is provided to the node ND. Here, the capacitor CP stores the voltage corresponding to the data signal.

When the i+1-th scan signal Si+1 provided to the i+1-th scan line SLi+1 has the low level S-LOW, the seventh transistor T7 is turned on.

When the seventh transistor T7 is turned on, the initialization voltage Vint is provided to the anode electrode of the organic light emitting element OLED, and the parasitic capacitor of the organic light emitting element OLED is discharged.

When the light emitting control signal Ei provided to the light emitting control line ECLi has the low level E-LOW, the fifth transistor T5 and the sixth transistor T6 are turned on. When the fifth transistor T5 is turned on, the first power ELVDD is provided to the first electrode of the first transistor T1. When the sixth transistor T6 is turned on, the second electrode of the first transistor T1 and the anode electrode of the organic light emitting element OLED are electrically connected to each other. Then, the organic light emitting element OLED generates light having luminance (e.g., predetermined luminance) corresponding to a provided current amount.

Figure 8:
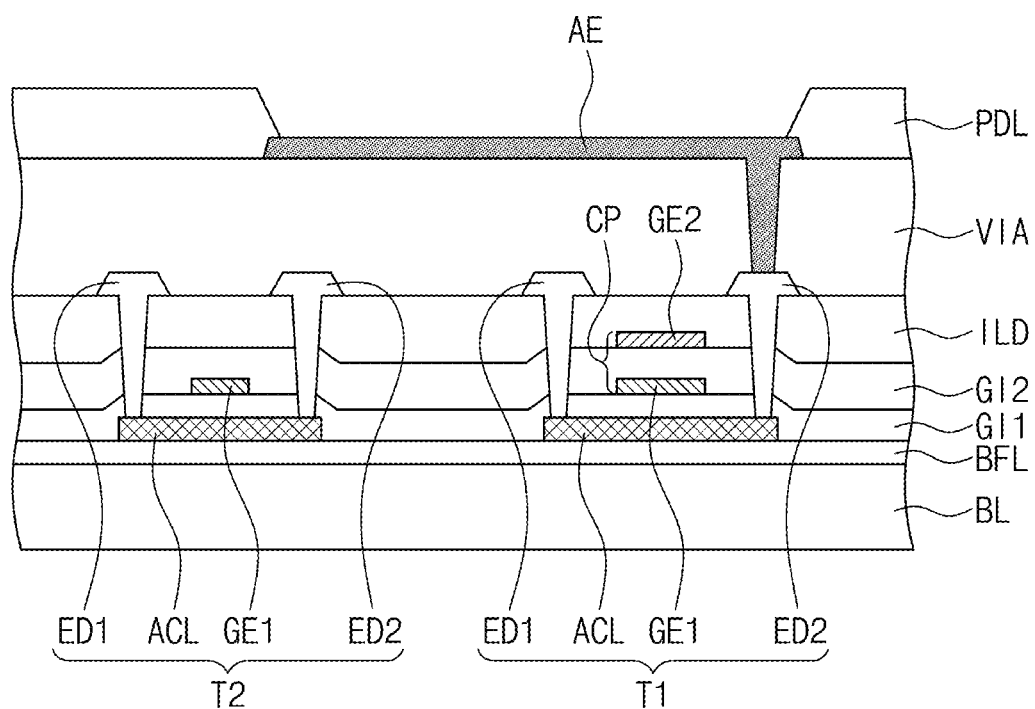
FIG. 8 is a cross-sectional view illustrating a portion of the pixel according to an embodiment of the inventive concept.

FIG. 8 is a cross-sectional view illustrating a portion of the pixel PX (refer to FIG. 6) according to an embodiment of the inventive concept. Although the first transistor T1 and the second transistor T2 are exemplarily illustrated in FIG. 8, embodiments of the inventive concept are not limited to the structure of the first transistor T1 and the second transistor T2. Although a second electrode ED2 of the first transistor T1 directly contacts an anode electrode AE of the pixel PX in FIG. 8, this illustration shows only a cross-sectional shape. In an embodiment, the first transistor T1 may be connected to the anode electrode AE of the pixel PX through the sixth transistor T6 as in FIG. 6.

In an embodiment, the display panel DP (refer to FIG. 5) may include a base layer BL, a buffer layer BFL, gate insulation layers GI1 and GI2, an interlayer insulation layer ILD, a circuit insulation layer VIA, and a pixel defining layer PDL.

The buffer layer BFL is disposed on a surface of the base layer BL.

The buffer layer BFL prevents or substantially prevents impurities existing in the base layer BL from being introduced into the pixel PX during a manufacturing process. In particular, the buffer layer BFL prevents or substantially prevents the impurities from being diffused into active portions ACL of the transistors T1 and T2 constituting the pixel PX.

The impurities may be introduced from the outside or generated when the base layer BL is thermally decomposed. The impurities may include a gas or sodium discharged from the base layer BL. Also, the buffer layer BFL blocks moisture from being introduced into the pixel PX from the outside.

The active portions ACL constituting each of the transistors T1 and T2 are disposed on the buffer layer BFL. In an embodiment, each of the active portions ACL may include amorphous silicon or polysilicon. In an embodiment, each of the active portions ACL may include a metallic oxide semiconductor.

Each of the active portions ACL may include a channel region that serves as a passage through which an electron or a hole is movable, and a first ion doping region and a second ion doping region, which are disposed with the channel region therebetween.

A first gate insulation layer GI1 covering the active portions ACL is disposed on the buffer layer BFL. The first gate insulation layer GI1 includes an organic layer and/or an inorganic layer. The first gate insulation layer GI1 may include a plurality of inorganic thin-films. In an embodiment, the plurality of inorganic thin-films may include a silicon nitride layer and a silicon oxide layer.

Control electrodes GE1 constituting each of the transistors T1 and T2 are disposed on the first gate insulation layer GI1. The control electrode GE1 of the first transistor T1 may be one of two electrodes constituting the capacitor CP. At least a portion of the scan lines SL (refer to FIG. 5) and the light emitting control lines ECL (refer to FIG. 5) may be disposed on the first gate insulation layer GI1.

A second gate insulation layer GI2 covering the control electrodes GE1 is disposed on the first gate insulation layer GI1. The second gate insulation layer GI2 includes an organic layer and/or an inorganic layer. The second gate insulation layer GI2 may include a plurality of inorganic thin-films. In an embodiment, the plurality of inorganic thin-films may include a silicon nitride layer and a silicon oxide layer.

Another electrode GE2 of the two electrodes constituting the capacitor CP (refer to FIG. 6) may be disposed on the second gate insulation layer GI2. That is, the electrode GE1 disposed on the first gate insulation layer GI1 and the electrode GE2 disposed on the second gate insulation layer GI2 overlap each other to provide the capacitor CP in FIG. 6. However, embodiments of the inventive concept are not limited to the shown arrangement structure of the electrodes constituting the capacitor CP.

The interlayer insulation layer ILD covering the electrode GE2 is disposed on the second gate insulation layer GI2. The interlayer insulation layer ILD includes an organic layer and/or inorganic layer. The interlayer insulation layer ILD may include a plurality of inorganic thin-films. In an embodiment, the plurality of inorganic thin-films may include a silicon nitride layer and a silicon oxide layer.

At least a portion of the data line DL (refer to FIG. 5) and the power line PL (refer to FIG. 5) may be disposed on the interlayer insulation layer ILD. The first electrode ED1 and the second electrode ED2 of each of the transistors T1 and T2 may be disposed on the interlayer insulation layer ILD.

The first electrodes ED1 and the second electrodes ED2 may be connected to the corresponding active portions ACL through a through-hole passing through the gate insulation layers GI1 and GI2 and the interlayer insulation layer ILD, respectively.

The circuit insulation layer VIA covering the first electrodes ED1 and the second electrodes ED2 is disposed on the interlayer insulation layer ILD. The circuit insulation layer VIA includes an organic layer and/or inorganic layer. The circuit insulation layer VIA may provide a planarization surface.

The pixel defining layer PDL and the organic light emitting element OLED (refer to FIG. 6) are disposed on the circuit insulation layer VIA. In FIG. 8, only the anode electrode AE of the organic light emitting element OLED is illustrated for convenience. Although not shown, the organic light emitting element OLED may further include a hole transporting region, a light emitting layer, an electron transporting region, and a cathode in addition to the anode electrode AE. Although not shown, the display panel DP may include a thin-film encapsulation layer for sealing the organic light emitting element OLED.

Figure 9B:
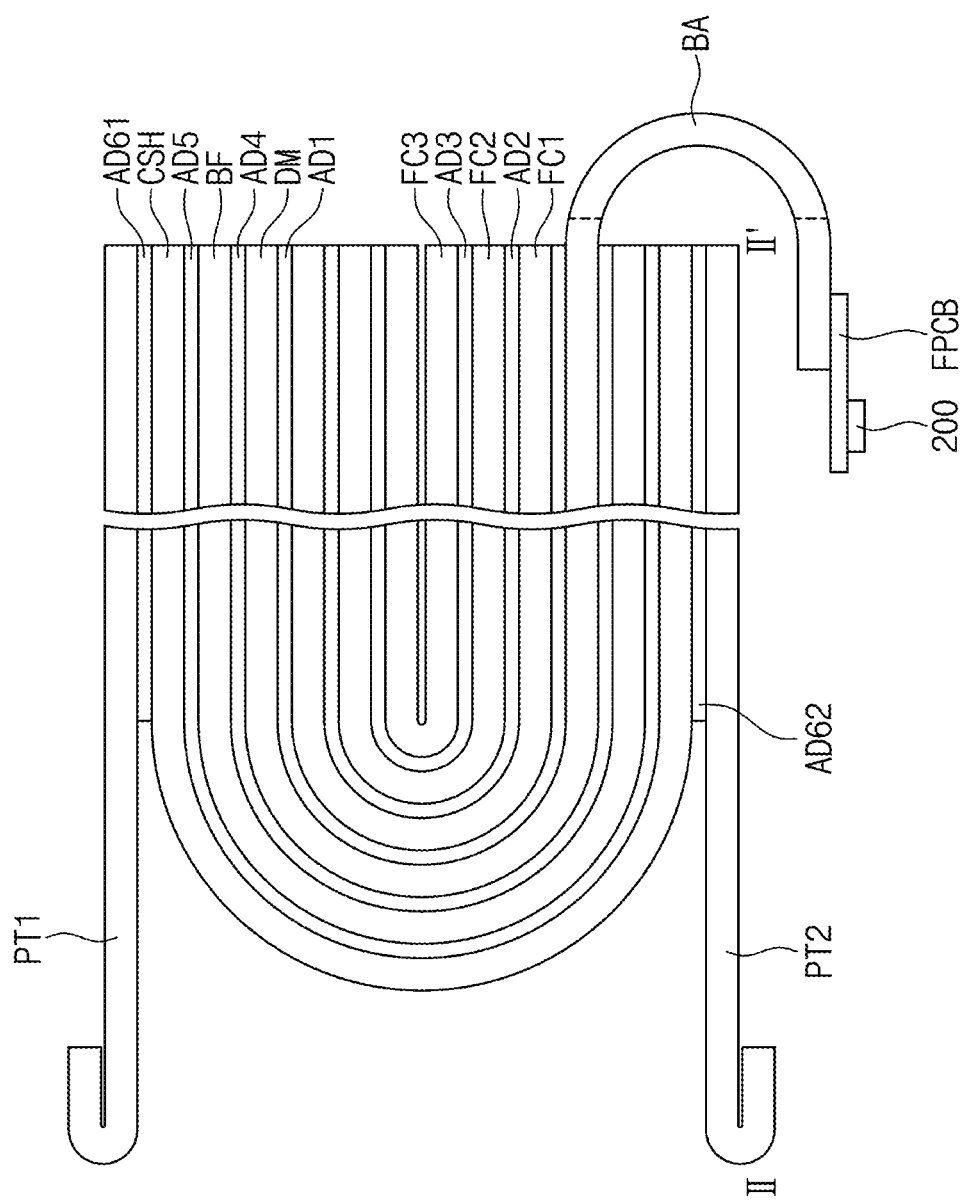
FIG. 9B is a view illustrating a portion of a cross-section taken along the line II-II' of FIG. 2A.
Figure 9C:
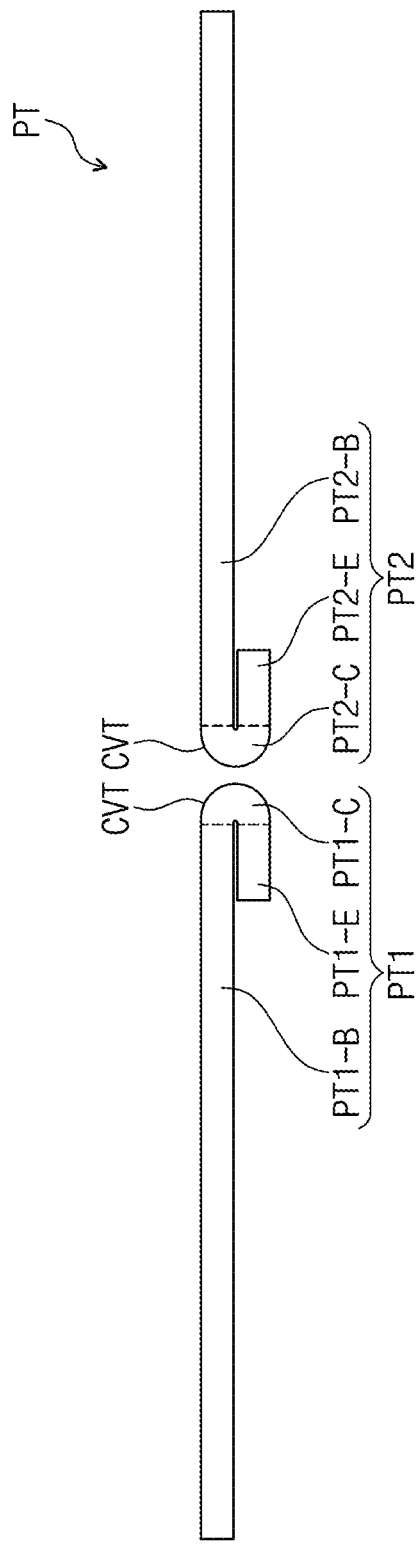
FIG. 9C is a view separately illustrating a support member in FIG. 9A.

FIG. 9A is a view illustrating a portion of a cross-section taken along the line I-I' of FIG. 1; and FIG. 9B is a view illustrating a portion of a cross-section taken along the line II-II' of FIG. 2A. That is, FIG. 9B is a view exemplarily illustrating a state in which the display device DD in FIG. 9A is folded. FIG. 9C is a view separately illustrating a support member PT in FIG. 9A.

Referring to FIG. 9A, the display area DA may include a first display area DA1 and a second display area DA2, which are distinguished with respect to the bending axis BX (refer to FIG. 2A).

The support member PT may include a first support member PT1 and a second support member PT2. The first support member PT1 overlaps with the first display area DA1 in the third direction DR3, and the second support member PT2 overlaps with the second display area DA2 in the third direction DR3.

In an embodiment, each of the first support member PT1 and the second support member PT2 may contain metal. In an embodiment, the metal may include iron, aluminum, stainless steel, copper, or zinc. However, embodiments of the inventive concept are not limited thereto.

Each of the first support member PT1 and the second support member PT2 may have a rigid property. However, when each of the first support member PT1 and the second support member PT2 has a sufficiently small thickness, each of the first support member PT1 and the second support member PT2 may have flexibility due to the small thickness.

The first support member PT1 and the second support member PT2 may be spaced by a distance (e.g., a predetermined distance) DT from each other.

The sixth adhesion member AD6 may include a first sub-adhesion member AD61 and a second sub-adhesion member AD62. The first sub-adhesion member AD61 and the second sub-adhesion member AD62 may be spaced apart from each other.

The first sub-adhesion member AD61 couples the first support member PT1 to the impact adsorbing member CSH, and the second sub-adhesion member AD62 couples the second support member PT2 to the impact adsorbing member CSH.

In an embodiment of the inventive concept, the bending axis BX (refer to FIG. 2A) may be defined by a boundary line between the first support member PT1 and the second support member PT2. In an embodiment of the inventive concept, the bending axis BX (refer to FIG. 2A) may be disposed on the boundary line between the first support member PT1 and the second support member PT2. In an embodiment of the inventive concept, the bending axis BX (refer to FIG. 2A) may be defined as an axis overlapping the boundary line between the first support member PT1 and the second support member PT2 in the third direction DR3.

Referring to FIG. 9B, a portion of the first support member PT1, which is adjacent to the bending axis BX (refer to FIG. 2A), and a portion of the second support member PT2, which is adjacent to the bending axis BX (refer to FIG. 2A), may not be attached to the sixth adhesion member AD6.

Accordingly, when the display device DD is folded with respect to the bending axis BX (refer to FIG. 2A), a stress or damage applied to components of the display device DD may be relieved by the benefit of the rigid property of each of the first support member PT1 and the second support member PT2.

As one portion of the display module DM is bent with respect to the bending area BA, the printed circuit board FPCB and the data driving unit 200 may be disposed below the support member PT.

Referring to FIG. 9C, the first support member PT1 may include a first base support portion PT1-B, a first connection support portion PT1-C, and a first extension support portion PT1-E. The second support member PT2 may include a second base support portion PT2-B, a second connection support portion PT2-C, and a second extension support portion PT2-E.

The first base support portion PT1-B and the second base support portion PT2-B serve to support the impact absorbing member CSH, the display module DM, and the like, which are disposed thereabove.

The first connection support portion PT1-C extends from the first base support portion PT1-B to the bending axis BX (refer to FIG. 2A). The first connection support portion PT1-C is disposed adjacent to the second connection support portion PT2-C. The first connection support portion PT1-C is bent to have a curvature (e.g., a predetermined curvature) CVT.

The second connection support portion PT2-C extends from the second base support portion PT2-B to the bending axis BX (refer to FIG. 2A). The second connection support portion PT2-C is disposed adjacent to the first connection support portion PT1-C. The second connection support portion PT2-C is bent to have a curvature (e.g., a predetermined curvature) CVT.

That is, an outer surface of each of the first connection support portion PT1-C and the second connection support portion PT2-C has a curvature (e.g., a predetermined curvature) CVT. The outer surface of the first connection support portion PT1-C and the outer surface of the second connection support portion PT2-C may face each other with respect to the bending axis BX.

The first extension support portion PT1-E extends from the first connection support portion PT1-C and overlaps with the first base support portion PT1-B in the third direction DR3.

The second extension support portion PT2-E extends from the second connection support portion PT2-C and overlaps with the second base support portion PT2-B in the third direction DR3.

In an embodiment of the inventive concept, at least a portion of the first extension support portion PT1-E contacts the first base support portion PT1-B, and at least a portion of the second extension support portion PT2-E contacts the second base support portion PT2-B.

In an embodiment of the inventive concept, the first base support portion PT1-B may be disposed between the first extension support portion PT1-E and the display module DM, and the second base support portion PT2-B may be disposed between the second extension support portion PT2-E and the display module DM.

In an embodiment of the inventive concept, the first extension support portion PT1-E may have an area less than that of the first base support portion PT1-B. Also, the second extension support portion PT2-E may have an area less than that of the second base support portion PT2-B. Here, the area may be measured when viewed from the third direction DR3.

In an embodiment of the inventive concept, the first base support portion PT1-B, the first connection support portion PT1-C, and the first extension support portion PT1-E may be integrated with each other. That is, as a portion of the first support member PT1 is bent, the first support member PT1 may be divided into the first base support portion PT1-B, the first connection support portion PT1-C, and the first extension support portion PT1-E. The second base support portion PT2-B, the second connection support portion PT2-C, and the second extension support portion PT2-E may be integrated with each other. That is, as a portion of the second support member PT2 is bent, the second support member PT2 may be divided into the second base support portion PT2-B, the second connection support portion PT2-C, and the second extension support portion PT2-E.

As described above, as a portion of the first support member PT1 and a portion of the second support member PT2 are bent, the first connection support portion PT1-C and the second connection support portion PT2-C are formed. Accordingly, although a stepped portion is generated between the first base support portion PT1-B and the second base support portion PT2-B during a manufacturing process, a stress or damage applied to the components disposed on the support member PT of the display device DD (refer to FIG. 1) may be relieved.

Also, although the display device DD (refer to FIG. 1) may be repeatedly folded, since the stress or damage applied to the components disposed on the support member PT is relieved, the display device DD may be improved in durability.

FIGS. 10 and 11 are views exemplarily illustrating support members PT-1 and PT-2 according to some embodiments of the inventive concept, respectively.

Referring to FIG. 10, the support member PT-1 may include a first support member PT1-1 and a second support member PT2-1.

Referring to FIG. 10, the first support member PT1-1 may include a first base support portion PT1-B, a first connection support portion PT1-C1, and a first extension support portion PT1-E1. The second support member PT2-1 may include a second base support portion PT2-B, a second connection support portion PT2-C1, and a second extension support portion PT2-E1.

The first connection support portion PT1-C1 extends from the first base support portion PT1-B. The first connection support portion PT1-C1 is disposed adjacent to the second connection support portion PT2-C1. The first connection support portion PT1-C1 is bent to have a curvature (e.g., a predetermined curvature) CVT-1.

The second connection support portion PT2-C1 extends from the second base support portion PT2-B. The second connection support portion PT2-C1 is disposed adjacent to the first connection support portion PT1-C1. The second connection support portion PT2-C1 is bent to have a curvature (e.g., a predetermined curvature) CVT-1.

That is, an outer surface of each of the first connection support portion PT1-C1 and the second connection support portion PT2-C1 has a curvature (e.g., a predetermined curvature) CVT-1.

In an embodiment, the curvature CVT-1 of each of the first connection support portion PT1-C1 and the second connection support portion PT2-C1 may be less than the curvature CVT of each of the first connection support portion PT1-C and the second connection support portion PT2-C in FIG. 9C.

The first extension support portion PT1-E1 extends from the first connection support portion PT1-C1 and overlaps with the first base support portion PT1-B. The first extension support portion PT1-E1 is bent to have a curvature (e.g., a predetermined curvature) CVT-2.

The second extension support portion PT2-E1 extends from the second connection support portion PT2-C1 and overlaps with the second base support portion PT2-B. The second extension support portion PT2-E1 is bent to have a curvature (e.g., a predetermined curvature) CVT-2.

In an embodiment, the curvature CVT-2 of each of the first extension support portion PT1-E1 and the second extension support portion PT2-E1 may be the same (same or substantially same) as the curvature CVT-1 of each of the first connection support portion PT1-C1 and the second connection support portion PT2-C1.

In an embodiment of the inventive concept, the first extension support portion PT1-E1 does not contact the first base support portion PT1-B, and the second extension support portion PT2-E1 does not contact the second base support portion PT2-B. That is, the first extension support portion PT1-E1 may be spaced by a distance (e.g., a predetermined distance) from the first base support portion PT1-B, and the second extension support portion PT2-E1 may be spaced by a distance (e.g., a predetermined distance) from the second base support portion PT2-B.

Description regarding other components may be substantially the same as that described in FIGS. 9A and 9C, and is thus omitted here.

Referring to FIG. 11, the support member PT-2 may include a first support member PT1-2 and a second support member PT2-2.

The first support member PT1-2 may include a first base support portion PT1-B, a first connection support portion PT1-C, and a first extension support portion PT1-E2. The second support member PT2-2 may include a second base support portion PT2-B, a second connection support portion PT2-C, and a second extension support portion PT2-E2.

The first extension support portion PT1-E2 extends from the first connection support portion PT1-C and overlaps with the first base support portion PT1-B.

The second extension support portion PT2-E2 extends from the second connection support portion PT2-C and overlaps with the second base support portion PT2-B.

In an embodiment, the first extension support portion PT1-E2 may have the same (same or substantially same) area as that of the first base support portion PT1-B. Also, the second extension support portion PT2-E2 may have the same (same or substantially same) area as that of the second base support portion PT2-B. Here, the area may be measured when viewed from the third direction DR3.

Description regarding other components may be substantially the same as that described in FIGS. 9A and 9C, and is thus omitted here.

Figure 12A:
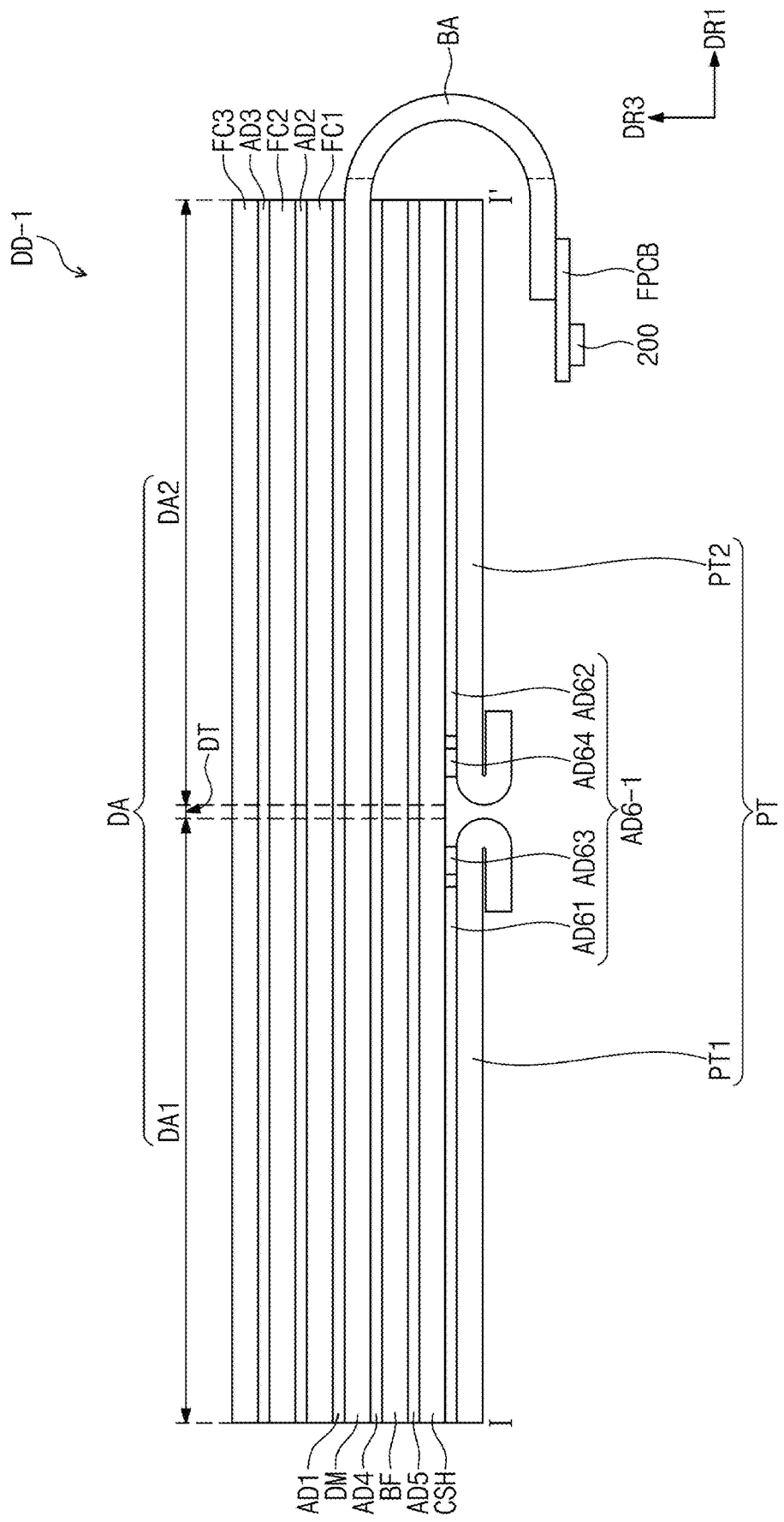
FIG. 12A is a view illustrating a portion of a cross-section taken along a line corresponding to the line I-I' of FIG. 1.
Figure 12B:
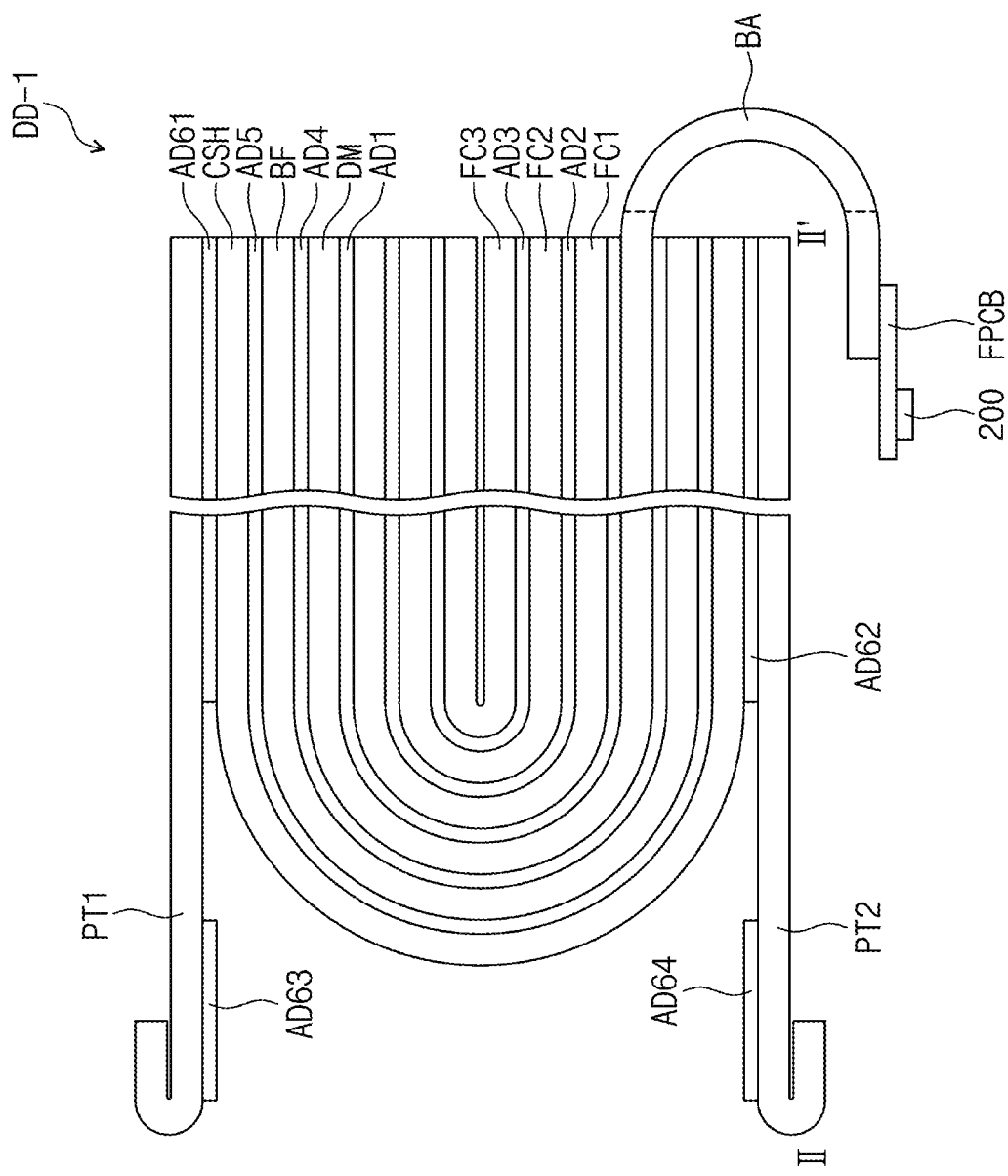
FIG. 12B is a view illustrating a portion of a cross-section taken along a line corresponding to the line II-II' of FIG. 2A.

FIG. 12A is a view illustrating a portion of a cross-section taken along a line corresponding to the line I-I' of FIG. 1; and FIG. 12B is a view illustrating a portion of a cross-section taken along a line corresponding to the line II-II' of FIG. 2A.

In an embodiment, a sixth adhesion member AD6-1 may include a first sub-adhesion member AD61, a second sub-adhesion member AD62, a third sub-adhesion member AD63, and a fourth sub-adhesion member AD64.

The third sub-adhesion member AD63 and the fourth sub-adhesion member AD64 are disposed between the first sub-adhesion member AD61 and the second sub-adhesion member AD62. In an embodiment, the third sub-adhesion member AD63 is spaced apart from the fourth sub-adhesion member AD64.

In an embodiment, the third sub-adhesion member AD63 is coupled to a surface of the first support member PT1, and is not coupled to a surface of the impact absorbing member CSH. That is, the third sub-adhesion member AD63 may have an adhesion force only on one side surface thereof.

In an embodiment, the fourth sub-adhesion member AD64 is coupled to a surface of the second support member PT2 and is not coupled to a surface of the impact absorbing member CSH. That is, the fourth sub-adhesion member AD64 may have an adhesion force only on one side surface thereof.

In an embodiment, each of the third sub-adhesion member AD63 and the fourth sub-adhesion member AD64 may have a black color. Accordingly, a folded portion of a display device DD-1 may be improved in visibility.

In an embodiment, since the third sub-adhesion member AD63 and the fourth sub-adhesion member AD64 are not coupled to the impact absorbing member CSH, a stress or damage generated on the display device DD-1 when the display device DD-1 is folded may be relieved.

FIG. 13 is a view illustrating a portion of the support member PT and the housing HS according to an embodiment of the inventive concept.

The housing HS may be disposed below the support member PT to accommodate the support member PT.

In an embodiment of the inventive concept, the housing HS may include a hinge HG. The hinge HG may be disposed at a position corresponding to the bending axis BX (refer to FIGS. 2A and 2B) and guides the display device DD to be folded.

The housing HS may support a first base support portion PT1-B and a second base support portion PT2-B.

In an embodiment of the inventive concept, a first connection support portion PT1-C and a second connection support portion PT2-C may be accommodated in a predetermined accommodation space SP defined in the housing HS. Also, a first extension support portion PT1-E and a second extension support portion PT2-E may be accommodated in the predetermined accommodation space SP defined in the housing HS.

When the display device DD is folded, a portion of the first support member PT1 and a portion of the second support member PT2 may be prevented or substantially prevented from contacting the housing HS by the predetermined accommodation space SP defined in the housing HS.

Although FIG. 13 is illustrated with reference to the support member PT in FIG. 9C, embodiments of the inventive concept are not limited thereto. For example, the above-described features may be also applied to the support member PT-1 in FIG. 10 and the support member PT-2 in FIG. 11.

According to embodiments of the inventive concept, a flexible display device having improved durability and a robust folding portion may be provided.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A display device comprising:
a flexible display module comprising a first display area and a second display area adjacent to the first display area, the flexible display module being foldable with respect to a boundary line between the first display area and the second display area; and
a support member comprising a first support member overlapping with the first display area and a second support member adjacent to the first support member and overlapping with the second display area, the support member being located below the flexible display module,
wherein the first support member comprises:
a first base support portion;
a first connection support portion extending from the first base support portion, located adjacent to the boundary line, and bent to have a curvature; and
a first extension support portion extending from the first connection support portion and overlapping with the first base support portion,
the second support member comprises:
a second base support portion;
a second connection support portion extending from the second base support portion, located adjacent to the boundary line, and bent to have a curvature; and
a second extension support portion extending from the second connection support portion and overlapping with the second base support portion, and
the first connection support portion is separate and spaced apart from the second connection support portion, and the first extension support portion is separate and spaced apart from the second extension support portion.

2. The display device of claim 1, further comprising an impact absorbing member between the flexible display module and the support member.

3. The display device of claim 2, further comprising an adhesion member comprising a first adhesion member and a second adhesion member, the adhesion member being between the impact absorbing member and the support member,
wherein the first base support portion is coupled to the impact absorbing member by the first adhesion member, and the second base support portion is coupled to the impact absorbing member by the second adhesion member.

4. The display device of claim 3, wherein at least a portion of the first connection support portion, the first extension support portion, at least a portion of the second connection support portion, and the second extension support portion are spaced apart from the adhesion member.

5. The display device of claim 4, wherein the first adhesion member is spaced apart from the second adhesion member.

6. A display device comprising:
a flexible display module comprising a first display area and a second display area adjacent to the first display area, the flexible display module being foldable with respect to a boundary line between the first display area and the second display area; and
a support member comprising a first support member overlapping with the first display area and a second support member overlapping with the second display area, the support member being located below the flexible display module,
wherein the first support member comprises:
a first base support portion;
a first connection support portion extending from the first base support portion, located adjacent to the boundary line, and bent to have a curvature; and
a first extension support portion extending from the first connection support portion and overlapping with the first base support portion,
the second support member comprises:
a second base support portion;
a second connection support portion extending from the second base support portion, located adjacent to the boundary line, and bent to have a curvature; and
a second extension support portion extending from the second connection support portion and overlapping with the second base support portion, and
the display device further comprises:
an impact absorbing member between the flexible display module and the support member; and
an adhesion member comprising a first adhesion member and a second adhesion member, the adhesion member being between the impact absorbing member and the support member,
wherein the first base support portion is coupled to the impact absorbing member by the first adhesion member, and the second base support portion is coupled to the impact absorbing member by the second adhesion member,
wherein at least a portion of the first connection support portion, the first extension support portion, at least a portion of the second connection support portion, and the second extension support portion are spaced apart from the adhesion member,
wherein the first adhesion member is spaced apart from the second adhesion member, and
wherein the adhesion member further comprises a third adhesion member between the first adhesion member and the second adhesion member, and a fourth adhesion member spaced apart from the third adhesion member.

7. The display device of claim 6, wherein the third adhesion member is coupled to only one surface of the first support member, and the fourth adhesion member is coupled to only one surface of the second support member.

8. The display device of claim 7, wherein each of the third adhesion member and the fourth adhesion member has a black color.

9. The display device of claim 3, further comprising a housing configured to accommodate the flexible display module, the impact absorbing member, the adhesion member, and the support member,
wherein the housing supports the first base support portion and the second base support portion, and
the first connection support portion and the second connection support portion are accommodated in a space defined in the housing.

10. The display device of claim 9, wherein, when the flexible display module is folded with respect to the boundary line, the first connection support portion and the second connection support portion are spaced apart from the housing.

11. The display device of claim 1, wherein at least a portion of a surface of the first base support portion contacts at least a portion of a surface of the first extension support portion, and
   at least a portion of a surface of the second base support portion contacts at least a portion of a surface of the second extension support portion.

12. The display device of claim 1, wherein each of the first extension support portion and the second extension support portion is bent to have a curvature,
   wherein the first extension support portion is spaced apart from the first base support portion, and the second extension support portion is spaced apart from the second base support portion.

13. The display device of claim 1, wherein the first base support portion has a same area as that of the first extension support portion, and the second base support portion has a same area as that of the second extension support portion.

14. The display device of claim 1, wherein the first base support portion has an area greater than that of the first extension support portion, and the second base support portion has an area greater than that of the second extension support portion.

15. The display device of claim 1, wherein each of the first support member and the second support member comprises a metal.

16. The display device of claim 1, wherein the flexible display module comprises a plurality of pixels each comprising a light emitting element, and a driving circuit configured to provide a data signal to the plurality of pixels, wherein the driving circuit is below the support member.

17. A display device comprising:
   a flexible display module comprising a flexible display panel and an input sensing circuit on the flexible display panel, the flexible display module being foldable with respect to a bending axis; and
   a support member comprising a first support member below the flexible display module and a second support member adjacent to the first support member, wherein the bending axis is defined by a boundary line between the first support member and the second support member,
   wherein, in each of an unfolded state in which the flexible display module is unfolded with respect to the bending axis and a folded state in which the flexible display module is folded with respect to the bending axis, each of a first portion of the first support member which is adjacent to the boundary line, and a second portion of the second support member which is adjacent to the boundary line, is bent to define a respective bent portion, the bent portion of the first portion of the first support member and the bent portion of the second portion of the second support member being separate and spaced apart from each other.

18. The display device of claim 17, further comprising an impact absorbing member between the flexible display module and the support member.

19. The display device of claim 18, further comprising an adhesion member,
   wherein the adhesion member comprises:
   a first adhesion member configured to couple the impact absorbing member and the first support member to each other; and
   a second adhesion member configured to couple the impact absorbing member and the second support member to each other, and being spaced apart from the first adhesion member.

20. The display device of claim 19, wherein the first portion of the first support member and the second portion of the second support member are spaced apart from the impact absorbing member.

* * * * *